(12) United States Patent
Arai et al.

(10) Patent No.: US 6,999,830 B2
(45) Date of Patent: Feb. 14, 2006

(54) METHOD AND DEVICE FOR PROCESSING SEMICONDUCTOR WAFER

(75) Inventors: Shinji Arai, Yamanashi (JP); Takamasa Chikuma, Yamanashi (JP); Masahiro Mochizuki, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/496,980

(22) PCT Filed: Nov. 29, 2002

(86) PCT No.: PCT/JP02/12549

§ 371 (c)(1),
(2), (4) Date: May 27, 2004

(87) PCT Pub. No.: WO03/046960

PCT Pub. Date: Jun. 5, 2003

(65) Prior Publication Data
US 2005/0015174 A1 Jan. 20, 2005

(30) Foreign Application Priority Data
Nov. 29, 2001 (JP) .............................. 2001-365247

(51) Int. Cl.
*G06F 19/00* (2006.01)

(52) U.S. Cl. .................. 700/100; 700/121; 700/112

(58) Field of Classification Search ................ 700/100, 700/121, 17, 18, 95, 112, 217, 103
See application file for complete search history.

(56) References Cited

U.S. PATENT DOCUMENTS

| 5,943,230 A | 8/1999 | Rinnen et al. ................ 700/18 |
| 6,535,784 B2 * | 3/2003 | Joma et al. ................. 700/121 |
| 6,694,218 B2 * | 2/2004 | Oh ............................. 700/217 |

FOREIGN PATENT DOCUMENTS

JP 7-335616 12/1995

* cited by examiner

*Primary Examiner*—Leo Picard
*Assistant Examiner*—Steven R. Garland
(74) *Attorney, Agent, or Firm*—Oblon, Spivak, McClelland, Maier & Neustadt, P.C.

(57) ABSTRACT

A method of processing a semiconductor wafer including the steps of executing a permutation processing by using a plurality of processing containers while sequentially transferring the wafers into the containers or performing a parallel processing and a transfer mechanism used commonly for the containers while sequentially transferring the wafers. The wafer processing is performed after the completion of conditioning of the vessel, and a conditioning start time for a next container is adjusted so that the completion of conditioning occurs when processing in the previous container is completed.

9 Claims, 9 Drawing Sheets

METHOD AND DEVICE FOR PROCESSING SEMICONDUCTOR WAFER

FIELD OF THE INVENTION

The present invention relates to a method and device for processing a semiconductor wafer by using a plurality of processing vessels for performing processes such as a film formation on the semiconductor wafer.

BACKGROUND OF THE INVENTION

In general a processing of semiconductor wafers is carried out by transferring semiconductor wafers into a plurality of processing vessels (chambers) prepared in a processing device by a transfer mechanism. For such processing of semiconductor wafers there are a sequential processing and a parallel processing. The sequential processing is performed by using a plurality of processing vessels each for executing different process, wherein a semiconductor wafer is sequentially transferred through the processing vessels. On the other hand, the parallel processing is performed by using a plurality of processing vessels for carrying out an identical process (e.g., a film formation process) and a transfer mechanism used therefor in common, wherein semiconductor wafers are sequentially transferred to the respective processing vessels by the transfer mechanism and the identical process is performed on respective wafers therein. The different processes in the sequential processing may include separate processes, e.g., a film formation process and an etching process, or a film formation process for forming films with different elements, e.g., Ti, TiN, W, WSi or the like, even in a single film formation process.

In both processing methods, temperature, pressure and other parameters in each processing vessel are controlled to be in a condition appropriate for adequately processing the semiconductor wafers, prior to loading the semiconductor wafers into the processing vessels. Hereinafter, controlling conditions of each processing vessel before performing a process will be referred to as conditioning. Such conditioning includes, e.g., a cleaning or a precoating performed after creating in a processing vessel the same atmosphere as in performing a process therein.

Conditioning times vary depending on the processing vessels. For instance, when process temperatures of the respective processing vessels are different from each other, the amount of time needed to raise the temperature to different process temperatures vary accordingly. Further, in case of performing different processes in the respective processing vessels, the cleaning times are different and, therefore, conditioning times are different. Moreover, since the cleaning times are determined based on the number of wafers to be loaded into the respective processing vessels in the aforementioned parallel processing, the cleaning times of the processing vessels are different from each other, making the conditioning times thereof different from each other.

In the conventional sequential processing as described above, the conditionings are started simultaneously in all processing vessels A to D, as shown in FIG. 8. Specifically, upon completion of conditioning $S_D$ of processing vessel D, which has the longest conditioning time S, the wafer is transferred to a first processing vessel A and then a processing $P_A$ is performed thereon. When a process P is completed in a preceding processing vessel, a transferring C of the wafer to a subsequent processing vessel is executed and a process P is performed therein.

As described above, by synchronizing the conditionings to start simultaneously in all processing vessels, there occur waiting time $W_A$, $W_B$, $W_C$ and $W_D$ between the time of completing the conditionings of the processing vessels and the time of starting the transferring of the wafers, which are different from each other.

For instance, though a process is first performed in the processing vessel A, the waiting time $W_A$ occurs until the conditioning time $S_D$ of the processing vessel D, which takes the longest time, lapses. Further, despite the long conditioning time $S_D$ of the processing vessel D and a processing $P_D$ thereof is performed last, there occurs a long wait time $W_D$ of the processing vessel D until the processes of the other processing vessels A to C are completed, since the conditioning thereof is started early.

As explained above, if there occur the different waiting time $W_A$, $W_B$, $W_C$ and $W_D$ in the processing vessels A to D, respectively, after finishing the conditionings thereof, an inner state of each processing vessel may undergo a subtle change before the wafer is loaded thereinto. In particular, the different waiting time period cause the temperature of each processing vessel (a temperature of a susceptor installed in each processing vessel or a temperature of each processing vessel affected by radiation of the susceptor) to be delicately changed, so that the temperatures of the processing vessels deviate from preset temperatures. Similarly in the above-described parallel processing, since the conditionings are simultaneously initiated in all processing vessels X, Y and Z, e.g., shown in FIG. 9, the different waiting time ($W_X=0$), $W_Y$ and $W_Z$ are generated. Thus, there is a problem with the processing results of the respective processing vessels, e.g., the thickness of films formed on a wafer delicately vary.

While sequentially processing a plurality of wafers, such a problem is most noticeable in a first processed wafer. The environment of each processing vessel is considered to be relatively more stable by the time of executing processing on the second wafer, compared to that during the processing of the first wafer. And during the processing of the first wafer, the environment is considered unstable.

Recently, a manufacturing of a semiconductor having a high accuracy is required with an advancement of a semiconductor product, which accompanies a demand for further improvement in accuracy in processing a semiconductor wafer, e.g., uniformity of a film formation or the like.

SUMMARY OF THE INVENTION

It is, therefore, an object of the present invention to provide a method and device for processing a semiconductor wafer, which enables a reliable process by preventing non-uniformity of inner states of a plurality of processing vessels caused by differences in waiting time between the processing vessels, i.e., differences in time between completion of conditionings of the processing vessels and the transfer of the wafers thereinto.

In accordance with one aspect of the invention, there is provided a semiconductor wafer processing for performing a sequential processing by using a plurality of processing vessels performing processes different from each other, the sequential processing being carried out by sequentially transferring a semiconductor wafer through the processing vessels, wherein a wafer processing in each processing vessel is performed after completing a conditioning of each processing vessel and wherein a start time of a conditioning of a next processing vessel is controlled such that the conditioning of the next processing vessel is completed in harmony with a completion of a processing of a preceding processing vessel.

By the above method, time intervals of the processing vessels between the completion times of the conditionings and start times of the processes can be made to be identical to each other and waiting time occurring after the completion of the conditionings can be considerably reduced.

In such case, it is preferable that a processing vessel to be initially conditioned is determined stepwise by comparing a conditioning time S of a specific processing vessel with a summation time T to determine a bigger one among the times S and T, the summation time T being a sum of a transferring time and a processing time of the wafer for each of one or more preceding processing vessels in which a processing is carried out prior to the specific processing vessel and a conditioning time of a processing vessel for performing a processing first through the preceding processing vessels.

In accordance with another aspect of the invention, there is provided a semiconductor wafer processing method for performing a parallel processing by employing a plurality of processing vessels performing an identical processing and a transfer mechanism commonly used for the processing vessels, the parallel processing being carried out by sequentially transferring semiconductor wafers to the respective processing vessels by the transfer mechanism and performing the identical processing on a semiconductor wafer in each of the processing vessels, wherein a wafer processing in each processing vessel is performed after completing a conditioning of each processing vessel and wherein a start time of a conditioning of a processing vessel is controlled such that the conditioning of the processing vessel is completed in harmony with a completion of a transferring of a wafer to a preceding processing vessel to which a wafer transferring is carried out prior to the former processing vessel.

By the above method, time intervals of the processing vessels between the completion times of the conditionings and start times of the processes can be made to be identical to each other and waiting time occurring after the completion of the conditionings can be considerably reduced.

In such case, it is preferable that conditionings are sequentially initiated in the processing vessels in an ascending order of conditioning times.

Doing so enables shortening of the whole time period for the parallel processing by using the plurality of processing vessels and an enhancement of processing efficiency.

In accordance with yet another aspect of the invention, there is provided a semiconductor wafer processing method by using a plurality of processing vessels, wherein a wafer is transferred into each processing vessel and processed therein after completing a conditioning of each processing vessel and wherein start times of conditionings of the processing vessels are controlled such that time intervals between completion times of the conditionings and processing start times in the respective processing vessel are identical to each other.

By performing the processing by the above method, the variation in time intervals between the completion times of the conditionings and the start times of the processes can be corrected.

Further, in accordance with the processing method of the present invention, the promoted processing efficiency enables reduction of consumption of a processing gas or energy such as a power.

In accordance with still another aspect of the invention, there is provided a semiconductor wafer processing device including a plurality of processing vessels configured for performing processings different from each other on a semiconductor wafer, a conditioning of each processing vessel being performed before starting a processing thereof, and a transfer mechanism for transferring the wafer through the processing vessels, wherein a sequential processing is performed while sequentially transferring the wafer through the processing vessels by using the transfer mechanism, a calculating unit for calculating, for each processing vessel, a start time of a conditioning of a next processing vessel such that the conditioning of the next processing vessel is completed in harmony with a completion of a processing of a preceding processing vessel, and a conditioning control unit for starting conditionings of the respective processing vessels according to start times calculated by the calculating unit.

DETAILED DESCRIPTION OF THE PREFERRED EMBODIMENT

The preferred embodiments of the present invention will be described in detail with reference to the accompanying drawings.

Processing Device

Figure 1:
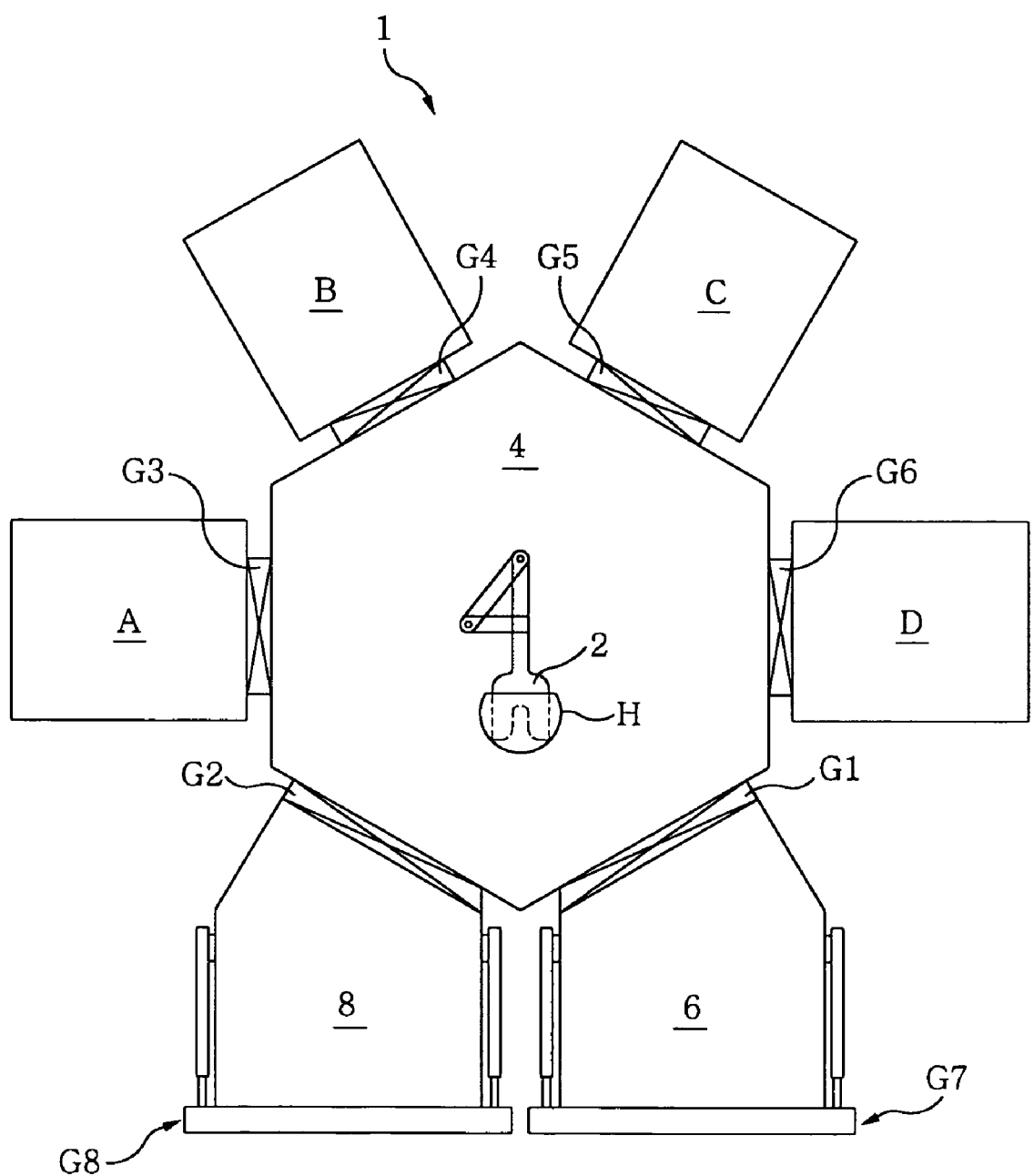
FIG. 1 shows a schematic horizontal sectional view of an exemplary device for executing a method for processing a wafer in accordance with a preferred embodiment of the present invention.
Figure 2:
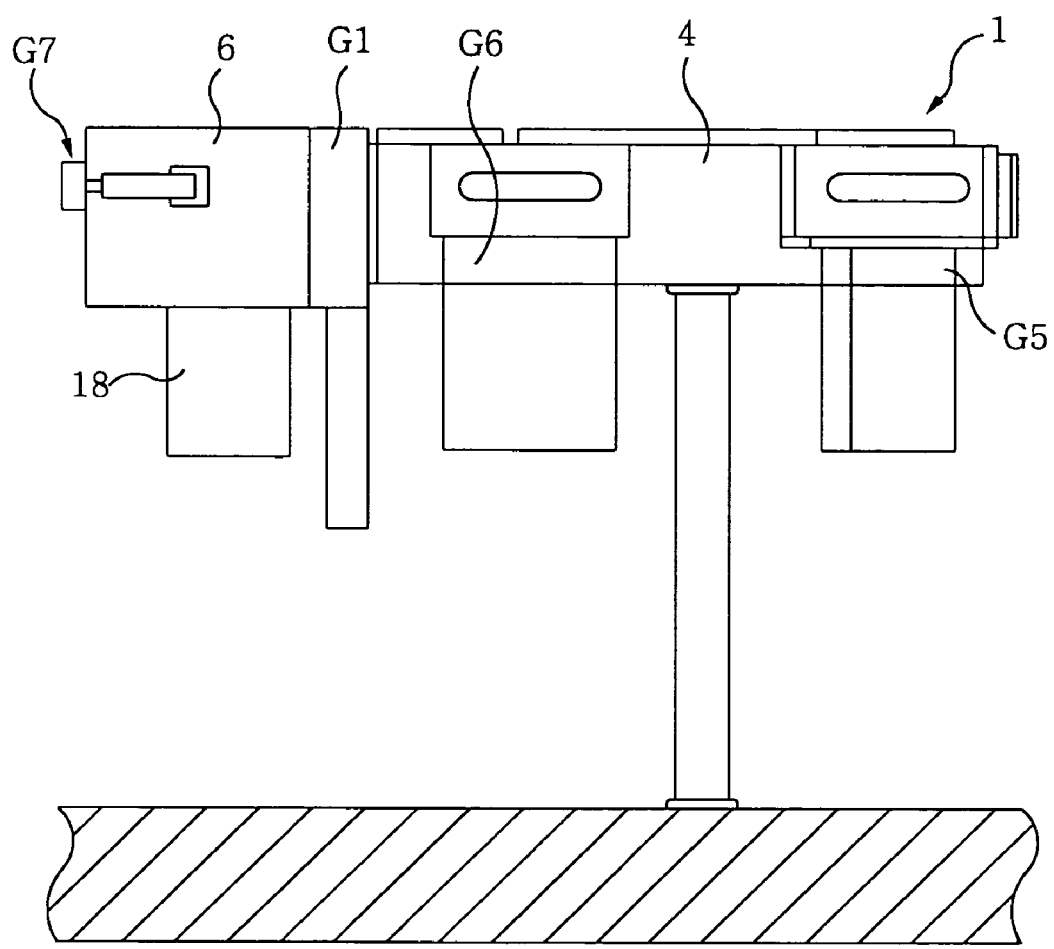
FIG. 2 gives a schematic side elevational view of the wafer processing device shown in FIG. 1.

FIGS. 1 and 2 are a horizontal sectional view and a side elevational view, respectively, schematically showing a wafer processing device 1 of, so called, multi-chamber type, including a plurality of processing vessels (chambers). Referring to FIGS. 1 and 2, the whole structure of the processing device 1 will now be described.

The processing device 1 is provided with a vacuum transfer chamber 4, two load lock chambers 6, 8 and four vacuum processing vessels (processing modules) A to D. FIG. 2 shows a state in which the processing vessels A to D have been detached from the processing device 1. The load lock chambers 6, 8 and the processing vessels A to D disposed around the transfer chamber 4 are connected thereto via gate valves G1 to G6, respectively. Installed in the transfer chamber 4 is a transfer arm 2 serving as a transfer mechanism for transferring a semiconductor wafer H and commonly used for the load lock chambers 6, 8 and the processing vessels A to D.

The respective processing vessels A to D are configured, e.g., to perform therein different processes from each other. The different processes may include different types of processes such as a film formation process and an etching process, or a film formation process for forming films with different materials, e.g., Ti, TiN, W, WSi or the like, in a single film formation process. Under such configuration, the sequential processing can be performed by transferring the wafer H through the processing vessels A to D in sequence. On the other hand, the processing vessels A to D can be configured in such a manner as to perform therein an identical process (e.g., a Ti film formation process). Also under such configuration, the parallel processing for performing a same process on respective wafers H can be carried out in each of the processing vessels A to D by transferring the respective wafers H thereto in order.

The load lock chambers 6, 8 are used for transferring the respective wafers H between a depressurized ambient of the transfer chamber 4 and an atmospheric ambient outside the transfer chamber 4, while maintaining a depressurized state inside the transfer chamber 4. The load lock chambers 6, 8 are designed to appropriately set ambient pressure thereof by employing a pressure control unit 18 (see FIG. 2) installed beneath the load lock chambers 6, 8, which includes a vacuum pump and a gas supplying system. The load lock chambers 6, 8 have openings leading to the outside, which are hermetically sealed to be opened and closed by gate valves G7 and G8, respectively. The opening and closing operations of the gate valves G7, G8 are carried out by raising and lowering valve bodies which make up the respective gate valves by using a driving unit (not shown).

There is provided in the processing device 1 a controller (a calculating unit, a condition control unit) (not shown) for controlling the operation of each of the units and performing a calculation. The controller includes a CPU (central processing unit), a ROM for storing, e.g., program data, enabling the CPU to control the operation of each unit and a RAM for providing a memory area for the CPU's data processing.

Sequential Processing

Hereinafter, there will be explained the sequential processing of a wafer by using the processing device 1 having the processing vessels A to D which perform therein the different processes from each other. In executing the sequential processing, the wafer is transferred to each of the processing vessels A to D in sequence by a transfer arm 2 under the control of the controller. Prior to transferring the wafer into the respective processing vessels A to D, conditioning such as cleaning, precoating and the like is performed so that conditions suitable for performing desired processes therein is established by controlling the temperature, pressure and other parameters thereof.

Figure 3:
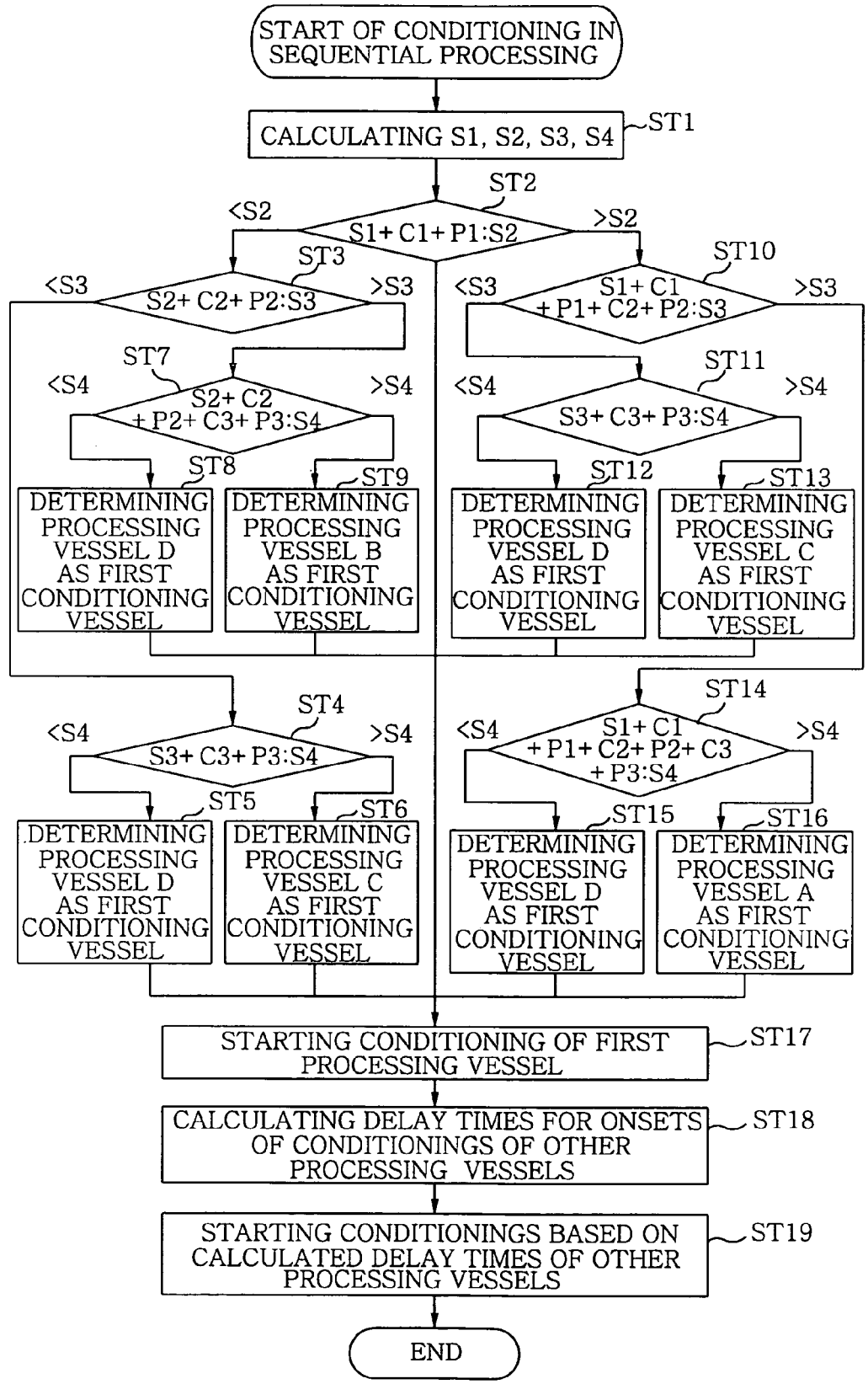
FIG. 3 offers a flow chart for illustrating a sequential processing for controlling start of conditionings of respective processing vessels by using the wafer processing device shown in FIG. 1.
Figure 4:
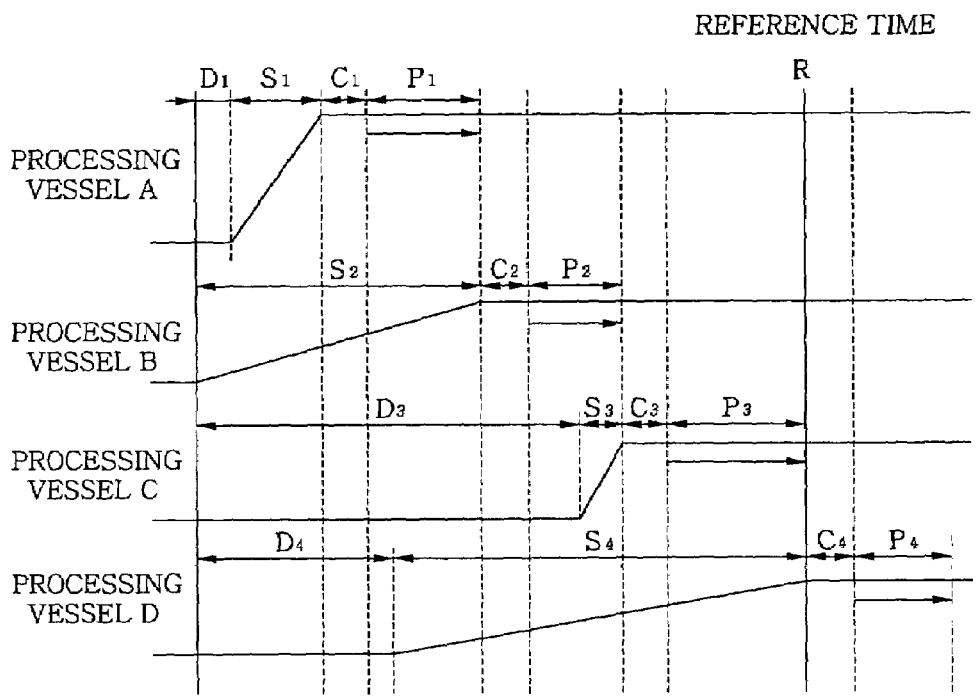
FIG. 4 presents a timing diagram of a case using the process illustrated in FIG. 3.

Herein, a conditioning performed prior to processing a first wafer in executing the sequential processing of a plurality of wafers will be described. There are shown in FIG. 3 a control mechanism of the controller up until the start of an execution of the conditioning of the processing vessels A to D thereby and in FIG. 4 an exemplary timing diagram of the sequential processing based on the control mechanism illustrated in FIG. 3. Referring to FIG. 4, S1 to S4 represent the amount of time required for performing the conditionings of the respective processing vessels A to D; and P1 to P4 represent the amount of time required for performing respective processes in the processing vessels A to D. Further, C1 to C4 are the amount of time required for transferring the wafer to the processing vessels A to D (time interval between completion of the conditioning and start of the process). Further, D1 to D4 are waiting times (delay times to be described later) designed to control starting points of the conditionings of the respective processing vessels A to D.

Referring to FIG. 3, the controller selects through the steps ST1 to ST16 a vessel in which a conditioning is to be initially performed. First, in the step ST1, the controller detects inner state of the processing vessels A to D, respectively, and then calculates the conditioning time S1 to S4 required to achieve an appropriate inner state for performing desired processes based on the detected inner state. For example, by detecting the temperature of a heater installed in each of the processing vessels A to D, a difference between the current temperature and the temperature appropriate to perform a process is obtained. Based on the thus obtained difference and a rate of rise of the temperature previously stored in, e.g., a memory, calculations are performed to obtain the amount of time required for controlling the inner states of the processing vessels appropriate for processes. The calculated time periods are represented by conditioning time S1 to S4.

Next, in the step ST2, a sum (S1+C1+P1) of the conditioning time S1, the transferring time C1 and the processing time P1 of the processing vessel A where a process is first performed is compared with the conditioning time S2 of the processing vessel B where a process is subsequently performed. If S1+C1+P1 is less than S2 (S1 +C1+P1<S2), the sum of the time periods in the processing vessel B (S2+C2+P2) is compared with the conditioning time S3 of the processing vessel C where a process is performed following the process of the processing vessel B, in the step ST3.

In the step ST3, if S2+C2+P2 is less than S3 (S2+C2+P2<S3), the sum of the time periods of the processing vessel C (S3+C3+P3) is compared with the conditioning time S4 of the processing vessel D where the process is last performed. If S3+C3+P3 is less than S4 (S3+C3+P3<S4), the processing vessel D is determined in the step ST5 as a processing vessel to be first conditioned and the conditioning thereof is started in the step ST17. In this case, the reason for initiating the conditioning of the processing vessel D first is that the processes (including the conditioning, transferring and processing) in the processing vessels A to C can be finished while performing the conditioning thereof.

If S3+C3+P3 is greater than S4 (S3+C3+P3>S4) in the step ST4, the processing vessel C is determined in the step ST6 as a first processing vessel to be conditioned, and a conditioning thereof is started in the step ST17. In this case, the reason of initiating the conditioning of the processing vessel C is that the processes in the processing vessels A and B can be completed while performing the conditioning thereof, and the conditioning of the processing vessel D can be finished while performing the conditioning and the process thereof.

On the other hand, if S2+C2+P2 is greater than S3 (S2+C2+P2>S3) in the step ST3, the sum of the conditioning time S2, the transferring time C2 and the processing time P2 of the processing vessel B, and the transferring time C3 and the processing time P3 of the processing vessel C (S2+C2+P2+C3+P3) is compared with the conditioning time S4 of the processing vessel D in the step ST7. If S2+C2+P2+C3+P3 is less than S4 (S2 +C2+ P2+C3+P3<S4), the processing vessel D is determined in the step ST8 as the processing vessel in which a conditioning is to be first executed and the conditioning thereof is started in the step ST17. However, if S2+C2+P2+C3+P3 is greater than S4 (S2+C2+P2+C3+P3>S4) in the step ST7, the processing vessel B is determined in the step ST9 as a processing vessel to be conditioned first and the conditioning thereof is started in the processing vessel B in the step ST17.

Going back to the step ST2, if S1+C1+P1 is greater than S2 (S1+C1+P1>S2), the sum of the conditioning time S1, the transferring time C1 and the processing time P1 of the processing vessel A, and the transferring time C2 and the processing time P2 of the processing vessel B is compared with the conditioning time S3 of the processing vessel C in the step ST10. If S1+C1+P1+C2+P2 is less than S3 (S1+C1+P1+C2+P2<S3), the sum of the time of the processing vessel C (S3+C3+P3) is compared with the conditioning time S4 of the processing vessel D in the step ST11.

If S3+C3+P3 is less than S4 (S3+C3+P3<S4) in the step ST11, the processing vessel D is determined in step ST12 as a processing vessel to be first conditioned, and the conditioning thereof is started in the step ST17. However, if S3+C3+P3 is greater than S4 (S3+C3+P3>S4), the processing vessel C is determined in the step ST13 as a processing vessel where the conditioning is first performed and a conditioning thereof is started in the step ST17.

On the other hand, if S1+C1+P1+C2+P2 is greater than S3 (S1+C1+P1+C2+P2>S3) in the step ST10, the sum of conditioning time S1 of the processing vessel A, transferring time and the processing time of the processing vessels A, B, C (S1+C1+P1+C2+P2+C3+P3) is compared with the conditioning time S4 of the processing vessel D. If S1+C1+P1+C2+P2+C3+P3 is less than S4 (S1+C1+P1+C2+P2+C3+P3<S4), the processing vessel D is determined in the step ST15 as a processing vessel to be first conditioned and the conditioning thereof is started in the step ST17. However, if S1+C1+P1+C2+P2+C3+P3 is greater than S4 (S1+C1+P1+C2+P2+C3+P3>S4) in the step 14, the processing vessel A is chosen in the step ST16 to be first conditioned and the conditioning thereof is initiated in the step ST17.

After initiating the conditioning in the first processing vessel in the step ST17, delay times D, i.e., waiting times of the other processing vessels until the conditionings are started therein, are calculated. Once a processing vessel to be first conditioned is determined, the delay times D can be calculated from the reference time which is determined based on the already calculated conditioning time S1 to S4, transferring time C1 to C4 and processing times P1 to P4 of the respective processing vessels A to D.

For example, referring to FIG. 4 showing the case in which a conditioning is first started in the processing vessel B, the completion time of the process in the processing vessel C is set to be the reference time R. The delay time D1 of the processing vessel A is obtained by D1=R−(S1+C1+P1+C2+P2+C3+P3) and the delay time D3 of the processing vessel C is obtained by D3=R−(S3+C3 +P3). Further, the delay time D4 is obtained by D4=R−S4.

Further, in the step ST19, the conditionings of the other processing vessels are initiated after the calculated delay time D has elapsed. In the case shown in FIG. 4, after a conditioning is first initiated in the processing vessel B, the conditionings of the processing vessels A, C and D are initiated after the respective delay times D1, D3 and D4 have elapsed.

As described above, a processing vessel in when a conditioning is to be first started is determined based on the conditioning times S of the processing vessels (steps ST1 to ST16) and, simultaneously, the delay times D of the other processing vessels are calculated (step ST18). The starting times of the conditionings of the processing vessels are adjusted by using the delay times D so that a conditioning in a subsequent processing vessel and a process in a preceding processing vessel are ended at the same time (steps ST17 and ST19).

By controlling the starting times of the conditionings as the above, the variation in time intervals between the ending point of the conditioning of a processing vessel and the starting point of the process of the processing vessel is not generated. Thus, the inner states of the processing vessels are prevented from being unstable and thereby being non-uniform during the time interval between the ending point of the conditioning and the starting point of the transfer of the wafers. Accordingly, in the semiconductor wafer process performed in each processing vessel, e.g., the film formation process, uniformity of the films formed thereby (thickness and quality of the film) can be improved.

Furthermore, the delay times D of the processing vessels A to D are calculated such that the conditioning of each processing vessel is completed right before transferring the wafer thereto (step ST18). Based on the calculated delay times, the start times of the conditionings are adjusted. By doing so, the amount of waiting time after completing the conditionings in the processing vessels can be considerably reduced (or completely removed theoretically).

Figure 8:
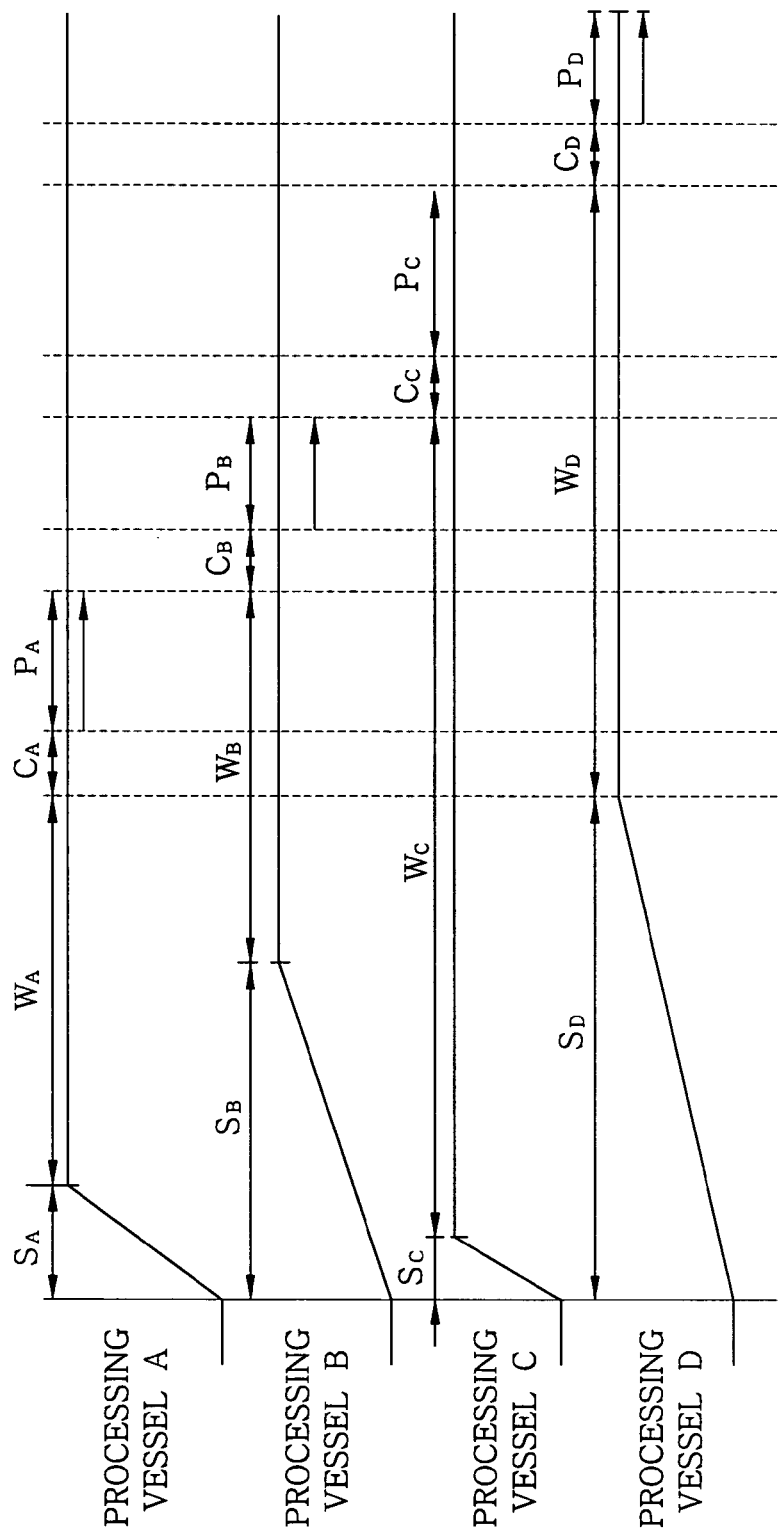
FIG. 8 gives a timing diagram of a sequential processing in accordance with a conventional wafer processing method.

Referring to FIGS. 4 and 8, the exemplary process in accordance with the present invention will be compared with a conventional process. As can be seen in FIG. 8 showing the conventional process, there exist the waiting time $W_A$, $W_B$, $W_C$ and $W_D$ different from each other, after the completion of the conditionings of the processing vessels A to D. In contrast, it can be seen in FIG. 4 that no waiting time W occurs owing to controlling of the delay times D.

In the present invention, a processing vessel to be first conditioned is chosen from the processing vessels A to D through the steps (steps ST2 to ST16 shown in FIG. 3) on the basis of the result of comparing the conditioning time S of a designated processing vessel with total time T (of the wafer transferring times C and the wafer processing times P of one or more preceding processing vessels where processes are to be performed prior to the process of the designated processing vessel and the conditioning time of a processing vessel where a process is first performed among one or more processing vessels). For example, when conditioning time (S2 as depicted in FIG. 4) of any processing vessel is greater than the sum (S1+C1+P1 as depicted in FIG. 4) of all the semiconductor wafer transferring times and all the processing times of the preceding processing vessels (depicted as processing vessel A in the example shown in FIG. 4) and conditioning time of a processing vessel first processed, the conditioning of the processing vessel (depicted as processing vessel B in the example shown in FIG. 4) is initiated ahead of time such that the processing of the preceding processing vessel A is concluded by the completion of the conditioning of the processing vessel B.

By this, the processes can be performed in the plurality of processing vessels with high efficiency, thereby improving a throughput of the sequential processing.

Parallel Processing

Hereinafter, the parallel processing of wafers by using the processing device 1 configured to have the processing vessels A to D for performing therein an identical process will be described. Under such configuration, one or more wafers are sequentially transferred into the respective processing vessels and then the identical process are performed on one or more wafers H in the respective processing vessels under the control of the controller. Further, in a similar manner as in executing the sequential processing, the conditioning such as cleaning, precoating and the like is performed in each of the processing vessels A to D to control the temperature, pressure and other parameters therein to be appropriate for performing desired processes, prior to transferring the wafers thereinto.

In particular, when the wafers are sequentially loaded into the processing vessels A to D by the single transfer arm 2, as shown in FIG. 1, the following scheme can be conceived. If until the completion of transferring of one or more wafers into a specific processing vessel, a conditioning of another processing vessel for performing therein a process subsequent to that of the specific processing vessel is set to be finished, the time intervals between the completion times of the conditionings and the start times of the processes can be the same in all the processing vessels and the wafers can be transferred efficiently.

Figure 5:
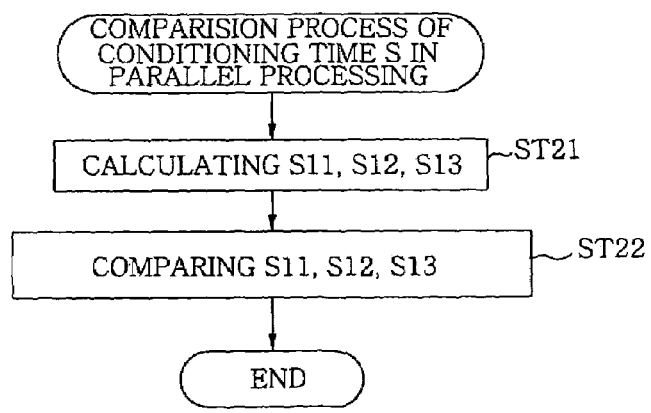
FIG. 5 provides a flow chart for describing a comparison process of conditioning times of the respective processing vessels in executing a parallel processing by using the wafer processing device illustrated in FIG. 1.
Figure 6:
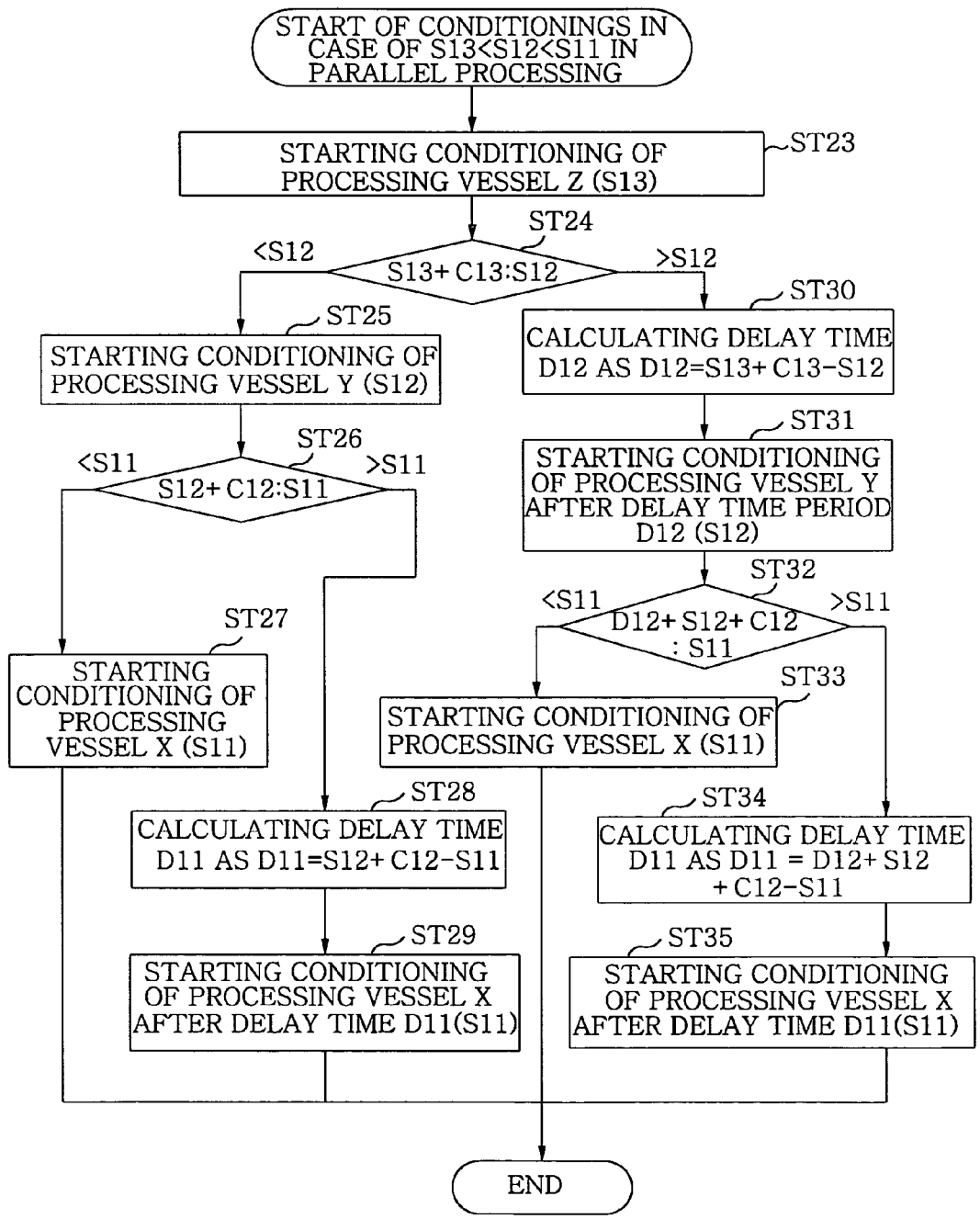
FIG. 6 offers a flow chart for describing a comparison process of the conditioning times of the respective processing vessels in case that a processing result of FIG. 5 is S13<S12<S11.
Figure 7:
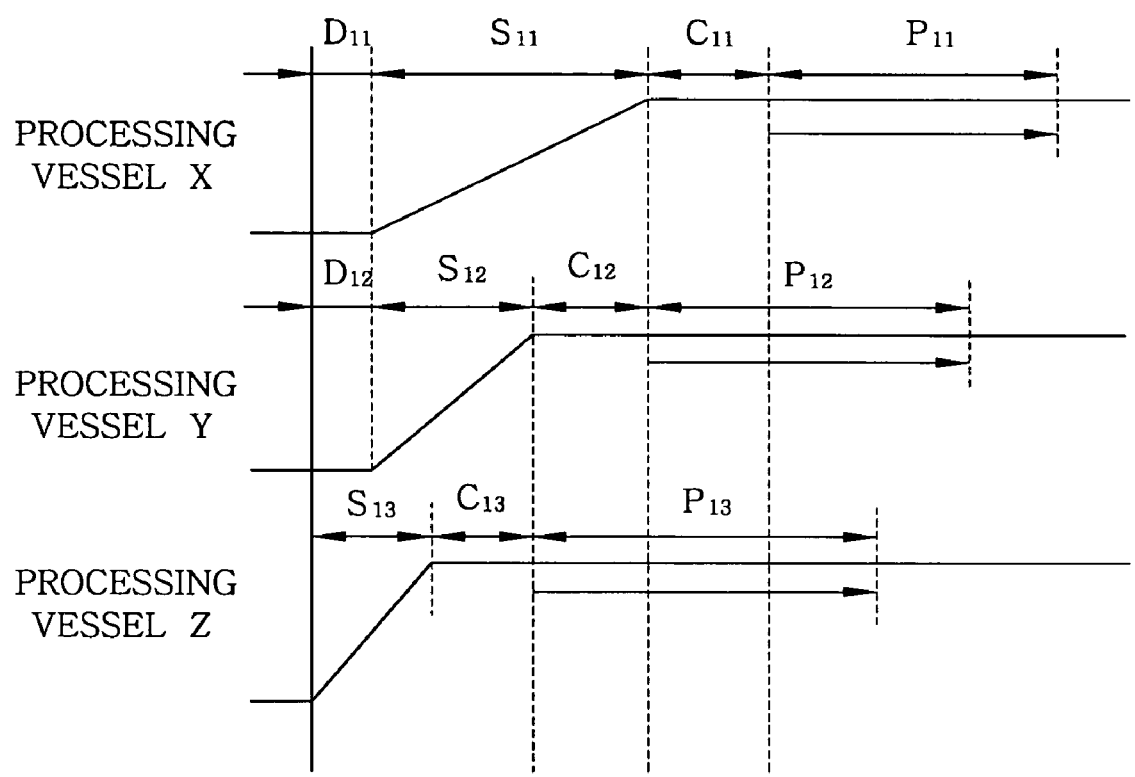
FIG. 7 provides a timing diagram of the processes presented in FIGS. 5 and 6.

Based on the aforementioned conception, there will now be explained the starting point of a conditioning performed prior to a processing of a first wafer in each processing vessel in executing the parallel processing. Herein, it is assumed that the parallel processing is executed by using a processing device having three processing vessels X, Y and Z, unlike the processing device 1 shown in FIG. 1. In this case, there are shown in FIGS. 5 and 6 the controlling processes of the controller until the starting points of the conditionings of the processing vessels X, Y, Z. FIG. 7 shows an exemplary timing diagram of the parallel processing executed based on the above. Further, S11, S12 and S13 shown in FIG. 7 denote the amount of time required in performing the conditionings of the processing vessels X, Y and Z, respectively; P11, P12 and P13, the amount of time required in performing the processes in the processing vessels X, Y and Z, respectively; and C11, C12 and C13, the amount of time required in transferring the wafers to the processing vessels X, Y and Z, respectively (time periods between the ending points of the conditionings and the starting points of the processes).

The controller makes a comparison of the conditioning times S to determine a processing vessel to be first conditioned, as shown in FIG. 5. Specifically, the respective conditioning times S11, S12, S13 of the processing vessels X, Y, Z are calculated in the step ST21, in a similar fashion as in the step ST1 shown in FIG. 3. Subsequently, the comparisons of S11, S12 and S13 are conducted in the step ST22 and the conditionings are initiated in the processing vessels with the shortest conditioning time S and sequentially in the other processing vessels in order of short conditioning times S. At this time, the starting points of the conditionings are controlled, such that concurrently with the completion of the transfer of the wafers to a processing vessel, the conditioning of another processing vessel to which next wafers are transferred (hereinafter, may be referred to as a subsequent processing vessel) is finished. To be concrete, the starting points of the conditionings are controlled in a manner that the delay time D of the subsequent processing vessel to which the next wafers are transferred is calculated and the conditioning of the subsequent processing vessel is started after waiting for the calculated delay time D.

Depending on the comparing results of the step ST22 shown in FIG. 5, processes for calculating the delay times differ. FIG. 6 shows a case of S13<S12<S11. In this case, a conditioning is initiated in the processing vessel Z having the shortest conditioning time S13 in the step ST23. Subsequently, the sum of the conditioning time and the transferring time (S13+C13) of the processing vessel Z is compared with the conditioning time S12 of the subsequent processing vessel Y in the step ST24.

If the sum of S13 and C13 is smaller than S12 (S13+C13<S12) in the step ST24, the conditioning is initiated in the processing vessel Y in the step ST25. Next, the sum of the conditioning time period and the transferring time (S12+C12) of the processing vessel Y is compared with the conditioning time S11 of the subsequent processing vessel X in the step ST26. If the sum of S12 and C12 is smaller than S11 (S12+C12<S11), the conditioning of the processing vessel X is started in the step 27. However, if the sum of S12 and C12 is greater than S11 (S12+C12>S11), the delay time D11 of the processing vessel X is obtained by an equation D11=S12+C12−S11 in the step ST28. In the step 29, the conditioning of the processing vessel X is started after waiting for the delay time D11.

Further, if the sum of S13 and C13 is greater than S12 (S13+C13>S12) in the step 24, the delay time D12 of the processing vessel Y is obtained by calculating an equation D12=S13+C13−S12 in the step ST30. In the step 31, the conditioning of the processing vessel Y is started after the delay time D12 has elapsed.

Thereafter, the sum of the delay time, the conditioning time and the transferring time (D12+S12+C12) of the processing vessel Y is compared with the conditioning time S11 of the subsequent processing vessel X in the step ST32. If the sum of D12, S12 and C12 is smaller than S11 (D12+S12+C12<S11) in the step ST32, the conditioning of the processing vessel X is started in the step ST33. However, if the sum of D12, S12 and C12 is greater than S11 (D12+S12+C12>S11) in the step ST32, a calculation using an equation D11=D12+S12+C12−S11 is conducted to obtain the delay time D11 of the processing vessel X in step ST34 and, in the step ST35, the conditioning of the processing vessel X is started after waiting for the delay time D1.

As described above, a processing vessel to be initially conditioned is determined based on the conditioning times S of the processing vessels (steps ST21 and ST22) and, at the same time, the delay times D of the remaining processing vessels are calculated (steps ST28, ST30, ST34). By using the calculated delay times, the starting points of the conditionings of the processing vessels are controlled so that the transferring of the wafers to a specific processing vessel and the conditioning of a processing vessel subsequent thereto are finished at the same time (steps ST23, ST25, ST27, ST29, ST31, ST33, ST35). By doing so, the variation in intervals between the ending point of the conditioning and the starting point of the process in each processing vessel can be corrected. Therefore, the inner states of the processing vessels are prevented from being in a non-uniform state caused by the unstable processing parameters therein during the time intervals. As a result, the uniformity of the semiconductor wafer process performed in each of the processing vessels, e.g., uniformity of a film formation (thickness and quality of the film), can be improved.

Furthermore, the start times of the conditionings are controlled by calculating the delay times D (step ST28, ST30, ST34) so that the conditionings are ended right before transferring the wafers into the processing vessels X, Y, Z. Such a control of the start times of the conditionings enables considerable reduction in the waiting times occurring after the completion of the conditionings in the processing vessels and efficient operation of the single transfer arm used in common for the processing vessels. Accordingly, a processing efficiency of the parallel processing by using the single transfer arm can be enhanced.

Figure 9:
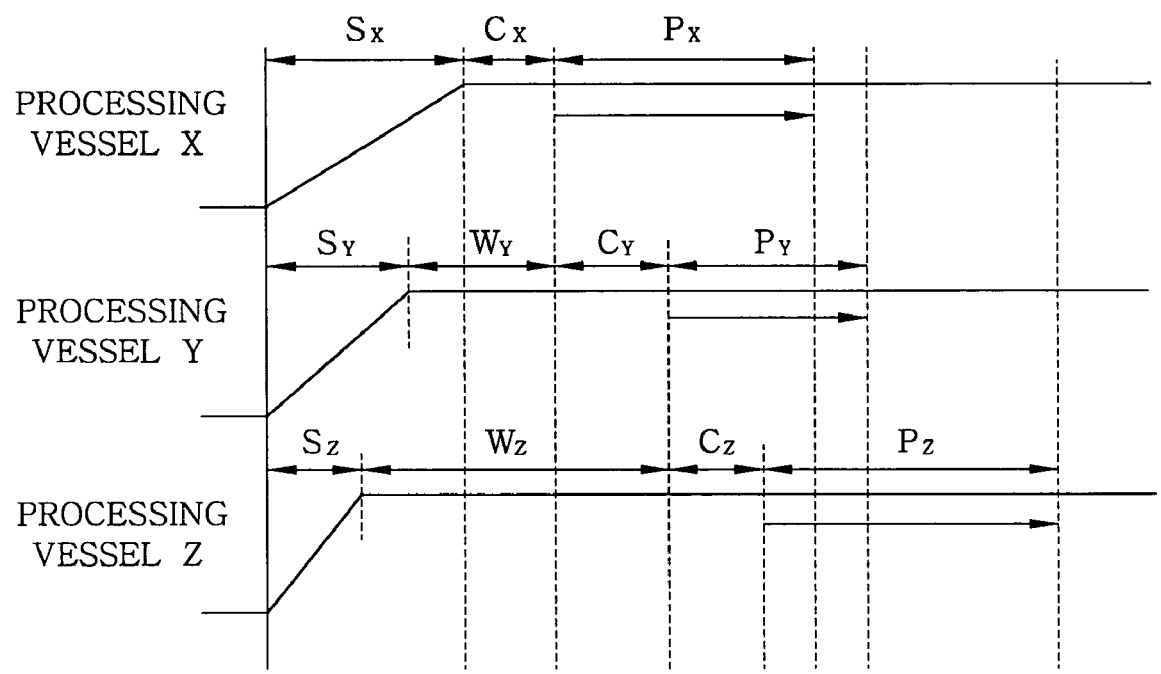
FIG. 9 offers a timing diagram of a parallel processing in accordance with a conventional wafer processing method.

Described below are results of the exemplary parallel processing shown in FIG. 7 in accordance with the present invention in comparison with that of the prior art shown in FIG. 9. In the prior art shown in FIG. 9, there are different waiting times ($W_X=0$), $W_Y$, $W_Z$ in the processing vessels X, Y, Z, respectively, after the completion of the conditionings. In contrast, there exists no waiting time W in FIG. 7 by using the delay time D.

Furthermore, in the present invention, the conditioning is initiated in a processing vessel with the shortest conditioning time S and sequentially in the other processing vessels in order of short conditioning times S. As a result, the processing efficiency in the plurality of processing vessels X, Y, Z is enhanced, which results in the improvement of a throughput of the parallel processing.

Additional Embodiment

Though the above embodiment has been described with respect to the conditioning for processing the first wafer in each processing vessel, it can be applied to the processes of successive wafers subsequent thereto. For instance, exemplified in FIG. 7A there is a flow chart of a process for controlling the start of a conditioning performed prior to a second process of the successive wafers (e.g., αth one) in the processing vessel C, in case of the sequential processing as shown in FIG. 4.

Figure 7A:
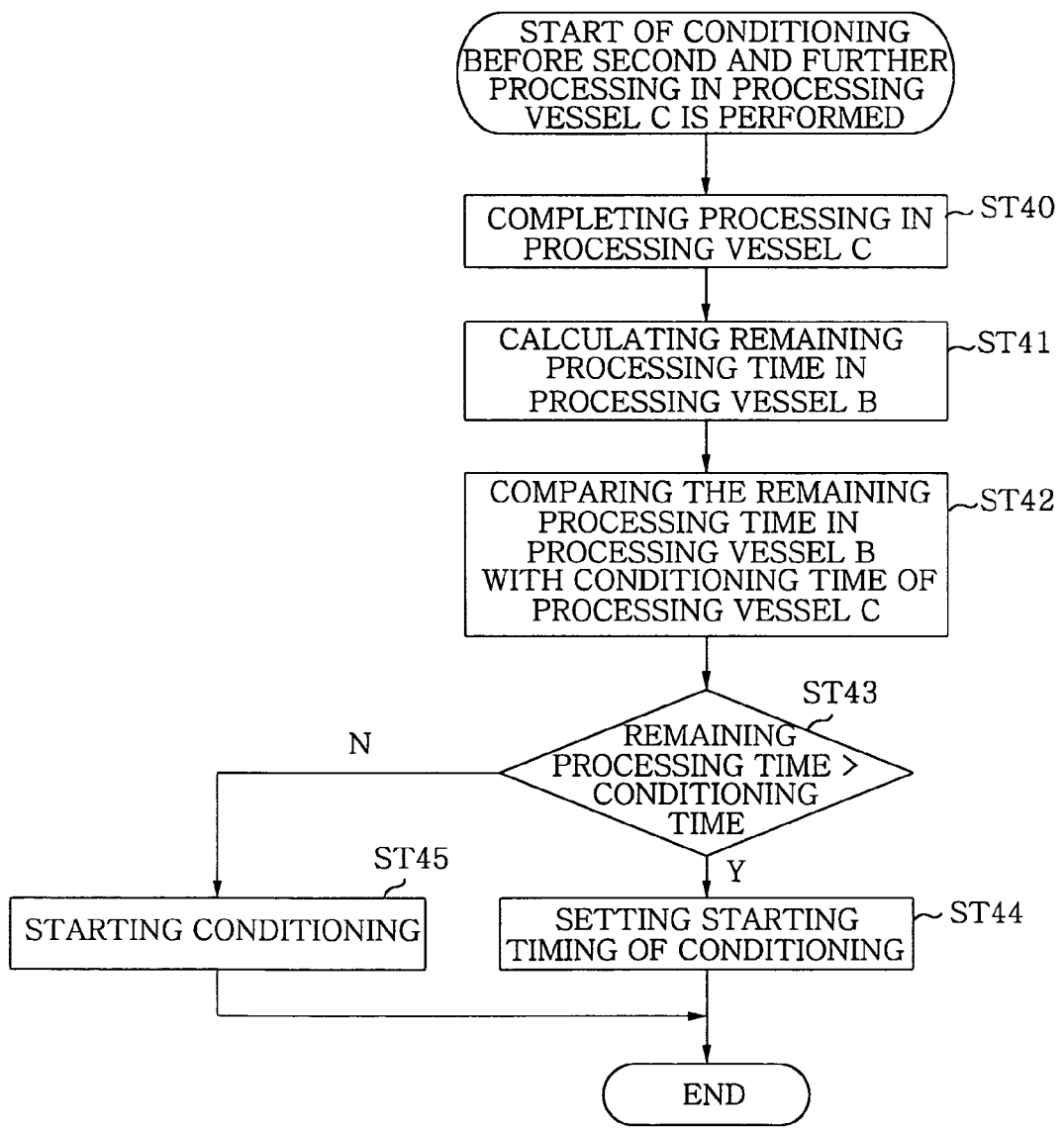
FIG. 7A shows a part of a process for controlling the starts of the conditionings when performing subsequent processes.

In FIG. 7A, at the moment of completing a process of an (α-1)th wafer in the processing vessel C (step ST40), the amount of time left to perform a process of an αth wafer in the processing vessel B is calculated (step ST41) Then the comparison of the amount of the calculated time left of the process in the processing vessel B with the amount of the conditioning time of the processing vessel C is carried out (step ST42). As the result of the comparison, if the amount of the time left is greater (step ST43), the start time of the conditioning of the processing vessel C to be performed prior to the process of the αth wafer therein is set by using the aforementioned delay time (step ST44). On the other hand, if the remaining time is shorter (step ST43), the same conditioning of the processing vessel C is started promptly (step ST45).

In addition, after the second wafer, the conditioning times may vary when processing wafers, however, it is possible to predict the time required for a following conditioning by detecting the state of the processing vessel.

MODIFIED EXAMPLE

In the above preferred embodiments, both of the parallel processing and the sequential processing are performed on the premises that the transfer arm 2 is located at the center of the vacuum transfer vessel 4 and, further, the distances between the transfer arm 2 and each of the processing vessels A to D (or X, Y, Z), the load lock chambers 6, 8 are substantially the same. Thus, the transferring times C1 to C4 (or C11 to C13) of the wafer are considered to be almost the same. However, if the transferring time periods are quite different from each other, or if the time intervals between the completion times of the conditionings and the start times of the processes need to be identical to each other, the following method may be used.

For instance, referring to FIGS. 3 and 4 illustrating the sequential processing, if a maximum value of the different transferring times C1 to C4 is represented by $C_{max}$, C1 to C4 are adjusted such that $C1=C2=C3=C4=C_{max}$. By doing so, the time intervals between the completion times of the conditionings and the start times of the processes can be made to be precisely identical to each other, though a time interval may be extended in some processing vessels. Further, by setting C1 to C4 as $C1=C2=C3=C4=Cmax+\Delta C$, C1 to C4 can be controlled arbitrarily by varying $\Delta C$. Furthermore, in executing the parallel processing shown in FIGS. 6 and 7, if a maximum value of C11 to C13 is $C_{max}$, the transferring time periods may be adjusted such that $C11=C12=C13=C_{max}$. By such adjustment, the time intervals of the processing vessels between the completion times of the conditionings and the start times of the processes can be precisely identical with each other, in executing the parallel processing.

In the above-described preferred embodiments of the present invention, the conditioning such as cleaning and precoating is performed to regulate the temperature, pressure, other parameters in each of the processing vessels to be suitable for performing a process, but the conditioning is not limited thereto. The conditioning may include other processes which make the state in each processing vessel suitable for performing therein the process. Further, the processing method of the present invention is applicable to a case of using the processing device including processing vessels for use in performing different processings and processing vessels for use in performing an identical processing together.

Furthermore, there has been described in the preferred embodiments (excluding the additional embodiment) the start timings of the conditionings of the processing vessels controlled prior to transferring the first wafer thereinto when processing the plurality of wafers but it is not limited thereto. In other words, the embodiment may be applied to a case of processing the subsequent wafers (or a case of resuming the process suspended due to a stopping of the device) or, to a case of intermittently processing a plurality of wafers if the conditioning of the processing vessel is required to be performed prior to transferring the wafer to be processed. The present invention is particularly effective when applied to a method for processing a plurality of wafers, where the conditioning is performed prior to the transfer of a first wafer into processing vessels.

Though the above embodiments were applied to a situation where the plurality of processing vessels are employed, the embodiments may be applied to a case in which a single processing vessel is employed. Specifically, by controlling a start time of a conditioning of the single processing vessel, a time interval between a completion time of the conditioning and a start time of a process can be reduced to the utmost and, therefore, the time interval effect is minimized. In this case, it is also effective to apply the present invention in which a conditioning of the processing vessel is performed prior to a transferring of a first wafer thereinto, when a plurality of wafers are processed.

Furthermore, though the single transfer arm is used in the present embodiments, the present invention can be applied to a case of using a plurality of transfer mechanisms such as the transfer arm.

In accordance with the present invention, the promoted processing efficiency enables reduction of consumption of a processing gas or energy such as a power.

While the invention has been shown and described with respect to the preferred embodiments with reference to the accompanying drawings, the present invention is not limited thereto. The present invention will be understood by those skilled in the art that various changes and modifications may be made without departing from the spirit and scope of the invention as defined in the following claims.

What is claimed is:

1. A semiconductor wafer processing method for performing a sequential processing by using a plurality of processing vessels performing processes different from each other, the sequential processing being carried out by sequentially transferring a semiconductor wafer through the processing vessels, wherein a wafer processing in each processing vessel is performed after completing a conditioning of said each processing vessel; and wherein a start time of a conditioning of a next processing vessel is calculated to achieve a completed conditioning thereof such that a processing of a preceding processing vessel is completed synchronously therewith.

2. A semiconductor wafer processing method for performing a sequential processing by using a plurality of processing vessels performing processes different from each other, the sequential processing being carried out by sequentially transferring a semiconductor wafer through the processing vessels, wherein a wafer processing in each processing vessel is performed after completing a conditioning of said each processing vessel; and wherein a start time of a conditioning of a next processing vessel is controlled such that the conditioning of the next processing vessel is completed in harmony with a completion of a processing of a preceding processing vessel, wherein a processing vessel to be conditioned first among the processing vessels is determined stepwise by comparing a conditioning time S of a specific processing vessel with a summation time T to determine a bigger one among the times S and T, the summation time T being a sum of a transferring time and a processing time of the wafer for each of one or more preceding processing vessels in which a processing is carried out prior to the specific processing vessel and a conditioning time of a processing vessel for performing a processing first among the preceding processing vessels.

3. A semiconductor wafer processing method for performing a parallel processing by employing a plurality of processing vessels performing an identical processing and a transfer mechanism commonly used for the processing vessels, the parallel processing being carried out by sequentially transferring semiconductor wafers to the respective processing vessels by the transfer mechanism and performing the identical processing on a semiconductor wafer in each of the processing vessels, wherein a wafer processing in each processing vessel is performed after completing a conditioning of said each processing vessel; and wherein a start time of a conditioning of a processing vessel is calculated to achieve a completed conditioning thereof such that a transferring of a wafer to a preceding processing vessel to which a wafer transferring is carried out prior to the processing vessel is completed synchronously therewith.

4. A semiconductor wafer processing method for performing a parallel processing by employing a plurality of processing vessels performing an identical processing and a transfer mechanism commonly used for the processing vessels, the parallel processing being carried out by sequentially transferring semiconductor wafers to the respective processing vessels by the transfer mechanism and performing the identical processing on a semiconductor wafer in each of the processing vessels, wherein a wafer processing in each processing vessel is performed after completing a conditioning of said each processing vessel; and wherein a start time of a conditioning of a processing vessel is controlled such that the conditioning of the processing vessel is completed in harmony with a completion of a transferring of a wafer to a preceding processing vessel to which a wafer transferring is carried out prior to the former processing vessel, wherein conditionings are sequentially initiated in the processing vessels in an ascending order of conditioning times.

5. A semiconductor wafer processing method by using a plurality of processing vessels, wherein a wafer is transferred into each processing vessel and processed therein after completing a conditioning of said each processing vessel; and wherein start times of conditionings of the processing vessels are calculated to achieve completed conditionings such that time intervals between completion times of the conditionings and processing start times in the respective processing vessel are identical to each other.

6. The method of claim 5, wherein, if transferring times to the respective processing vessels differ from each other, the time intervals between completion times of the conditionings and processing start times in the respective processing vessel are set to be identical to a maximum value of the transferring times.

7. The method of claim 5, wherein, if transferring times to the respective processing vessels differ from each other, the time intervals between completion times of the conditionings and processing start times in the respective processing vessel are set to be greater than a maximum value of the transferring times.

8. A semiconductor wafer processing device, comprising:

a plurality of processing vessels configured for performing processings different from each other on a semiconductor wafer, a conditioning of each processing vessel being performed before starting a processing thereof; and a transfer mechanism for transferring the wafer through the processing vessels, wherein a sequential processing is performed while sequentially transferring the wafer through the processing vessels by using the transfer mechanism, a calculating unit for calculating, for each processing vessel, a start time of a conditioning of a next processing vessel such that the conditioning of the next processing vessel is completed in harmony with a completion of a processing of a preceding processing vessel; and a conditioning control unit for starting conditionings of the respective processing vessels according to start times calculated by the calculating unit.

9. A semiconductor wafer processing device, comprising:

a plurality of processing vessels configured for performing an identical processing on a semiconductor wafer, a conditioning of each processing vessel being performed before starting a processing thereof;

a transfer mechanism for transferring the wafer through the processing vessels, wherein a parallel processing is performed while sequentially transferring the wafer through the processing vessels by using the transfer mechanism;

a calculating unit for calculating, for each processing vessel, a start time of a conditioning of a next processing vessel to achieve a completed conditioning thereof such that a transferring of a wafer to a preceding processing vessel is completed synchronously therewith; and a conditioning control unit for starting conditionings of the respective processing vessels according to start times calculated by the calculating unit.

* * * * *